US011223357B2

(12) United States Patent
Hsieh et al.

(10) Patent No.: US 11,223,357 B2
(45) Date of Patent: Jan. 11, 2022

(54) KEYSWITCH

(71) Applicant: DARFON ELECTRONICS CORP., Taoyuan (TW)

(72) Inventors: Yu-Chun Hsieh, Taoyuan (TW); Chen Yang, Taoyuan (TW); Chia-Hung Liu, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 143 days.

(21) Appl. No.: 16/746,997

(22) Filed: Jan. 20, 2020

(65) Prior Publication Data

US 2020/0244261 A1 Jul. 30, 2020

(30) Foreign Application Priority Data

Jan. 28, 2019 (TW) .................................. 108103026

(51) Int. Cl.
*H03K 17/968* (2006.01)
(52) U.S. Cl.
CPC . *H03K 17/968* (2013.01); *H03K 2217/94104* (2013.01); *H03K 2217/94116* (2013.01); *H03K 2217/96062* (2013.01)
(58) Field of Classification Search
None
See application file for complete search history.

(56) References Cited

U.S. PATENT DOCUMENTS

| 4,418,252 A | 11/1983 | Daigle |
| 6,483,050 B1 | 11/2002 | Narusawa |
| 2008/0211696 A1 | 9/2008 | Griffin |
| 2009/0277763 A1 | 11/2009 | Kyowski |
| 2017/0169967 A1* | 6/2017 | Chen ............... H03K 17/968 |

FOREIGN PATENT DOCUMENTS

| CN | 104299818 A | 1/2015 |
| CN | 205943875 U | 2/2017 |
| CN | 107359071 A | 11/2017 |
| CN | 108305806 A | 7/2018 |
| CN | 108962654 A | 12/2018 |
| TW | 200523964 | 7/2005 |
| TW | 201835959 A | 10/2018 |

* cited by examiner

*Primary Examiner* — Daniel C Puentes
(74) *Attorney, Agent, or Firm* — Winston Hsu

(57) ABSTRACT

A keyswitch includes a circuit board, a bottom board abutting against the circuit board, a cap, a light receiver and a light emitter disposed on the circuit board and opposite to each other, a base disposed on the circuit board, a cover disposed on the base, a first elastic member disposed through the cover and the base, a support device, and a second elastic member fixed to the base and having a flexible rod. The support device is movably connected to the cap and bottom board and has a sheet structure. When the cap is pressed, the sheet structure blocks light transmission between the light emitter and the light receiver to generate a triggering signal. When the cap is pressed to make the flexible rod deform downward with the sheet structure and then cross the sheet structure, the flexible rod is released to collide with the cover to make sound.

22 Claims, 11 Drawing Sheets

KEYSWITCH

BACKGROUND OF THE INVENTION

1. Field of the Invention

The present invention relates to a keyswitch, and more specifically, to a keyswitch utilizing a sheet structure of a support device to press a flexible rod of an elastic member for providing a tactile feedback and for blocking light transmission between a light emitter and a light receiver to generate a triggering signal.

2. Description of the Prior Art

A keyboard, which is the most common input device, could be found in variety of electronic apparatuses for users to input characters, symbols, numerals and so on. Furthermore, from consumer electronic products to industrial machine tools, they are all equipped with a keyboard for performing input operations.

In practical application, for efficiently increasing the triggering accuracy and solving the problem that switch components of a mechanical keyswitch is easily abraded and the related welding process is complicated, an optical triggering design has been developed to replace the mechanical keyswitch triggering design. The conventional optical triggering design involves disposing a light emitter and a light receiver opposite to each other to be located between a cap and a bottom board and utilizing an optical member to conduct or block light transmission between the light emitter and the light receiver, so as to achieve the triggering purpose.

Furthermore, the keyswitch could further adopt the clicky tactile feedback design. The clicky tactile feedback design usually involves additionally disposing a flexible acoustic member in the keyswitch to interfere with a rib of a sleeve of the keyswitch. Accordingly, when a user presses the keyswitch, the rib presses the flexible acoustic member to deform, and then the flexible acoustic member crosses the rib to generate a tactile feedback or further collides with an internal member of the keyswitch to make sound.

However, in the practical application adopting the aforesaid optical triggering and clicky tactile feedback designs, time difference between keyswitch triggering and tactile feedback (keyswitch triggering is usually designed to be later than tactile feedback) is inconsistent because the optical member and the rib are disposed at the different positions, so as to provide a user with an inconsistent pressing feeling when the user presses the cap at different positions.

SUMMARY OF THE INVENTION

The present invention provides a keyswitch. The keyswitch includes a circuit board, a bottom board, a cap, a light receiver, a light emitter, a base, a cover, a first elastic member, a second elastic member, and a support device. The bottom board abuts against the circuit board. The cap is located above the bottom board. The light receiver is disposed on the circuit board. The light emitter is disposed on the circuit board and opposite to the light receiver for emitting light to the light receiver. The base is disposed on the circuit board. The cover is disposed on the base. The first elastic member is disposed through the cover and the base to drive the cap away from the base. The second elastic member is fixed to the base. The second elastic member has a flexible rod. The support device is disposed between the cap and bottom board. The support device includes a first support member and a second support member. The first support member and the second support member are movably connected to the cap and the bottom board and pivotably intersect with each other to make the cap movable relative to the bottom board. The first support member has a sheet structure. The sheet structure has a protruding rib and a shielding board extending toward the circuit board. When the cap is pressed, the shielding board moves downward with the first support member to block light transmission between the light emitter and the light receiver to generate a triggering signal. When the cap is pressed and deformation of the flexible rod caused by pressing of the protruding rib is enough to make the flexible rod cross the protruding rib, the flexible rod is released and then moves upward to collide with the cover to make sound.

The present invention further provides a keyswitch. The keyswitch includes a circuit board, a bottom board, a cap, a light receiver, a light emitter, a base, a cover, a first elastic member, a second elastic member, and a support device. The bottom board abuts against the circuit board. The cap is located above the bottom board. The light receiver is disposed on the circuit board. The light emitter is disposed on the circuit board and opposite to the light receiver for emitting light to the light receiver. The base is disposed on the circuit board. The second elastic member is fixed to the base. The second elastic member has a flexible rod. The cover is disposed on the base. A first guiding surface structure and a second guiding surface structure are formed on the cover and the base respectively corresponding to the flexible rod and are separate from each other to cooperatively form a limiting rail. The flexible rod is movably inserted into the limiting rail. The first elastic member is disposed through the cover and the base to drive the cap away from the base. The support device is disposed between the cap and bottom board. The support device includes a first support member and a second support member. The first support member and the second support member are movably connected to the cap and the bottom board and pivotably intersect with each other to make the cap movable relative to the bottom board. The first support member has a sheet structure. The sheet structure has a protruding rib and a shielding board extending toward the circuit board. When the cap is pressed, the shielding board moves downward with the first support member to block light transmission between the light emitter and the light receiver to generate a triggering signal. When the cap is pressed and the flexible rod is pressed by the protruding rib, the flexible rod crosses the protruding rib along the limiting rail.

The present invention further provides a keyswitch. The keyswitch includes a circuit board, a bottom board, a cap, a light receiver, a light emitter, a base, a cover, an elastic member, and a support device. The bottom board abuts against the circuit board. The cap is located above the bottom board. The light receiver is disposed on the circuit board. The light emitter is disposed on the circuit board and opposite to the light receiver for emitting light to the light receiver. The base is disposed on the circuit board. The cover is disposed on the base. The elastic member is disposed through the base and the cover for driving the cap away from the base. The support device is disposed between the cap and bottom board. The support device includes a first support member and a second support member. The first support member and the second support member are movably connected to the cap and the bottom board and pivotably intersect with each other to make the cap movable relative to the bottom board. The first support member has a sheet structure. The sheet structure has a shielding board extending toward the circuit board. The bottom board has a hollow region corresponding to the support device. At least one limiting block extends inwardly and horizontally from a first internal edge of the hollow region corresponding to an end of the second support member connected to the bottom board. When the cap is pressed, the shielding board moves downward with the first support member to block light transmission between the light emitter and the light receiver to generate a triggering signal. When the cap is pressed and the end of the second support member partially enters the hollow region, the at least one limiting block blocks the end of the second support member connected to the bottom board.

The present invention further provides a keyswitch. The keyswitch includes a circuit board, a bottom board, a cap, a light emitting unit, an elastic member and a support device. The circuit board abuts against the bottom board. The cap has a scattering block disposed on a bottom surface of the cap. The elastic member is disposed between the cap and the bottom board. The light emitting unit is disposed on the circuit board. Light emitted by the light emitting unit passes through the scattering block. The support device is disposed between the bottom board and the cap to make the cap movable relative to the bottom board.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
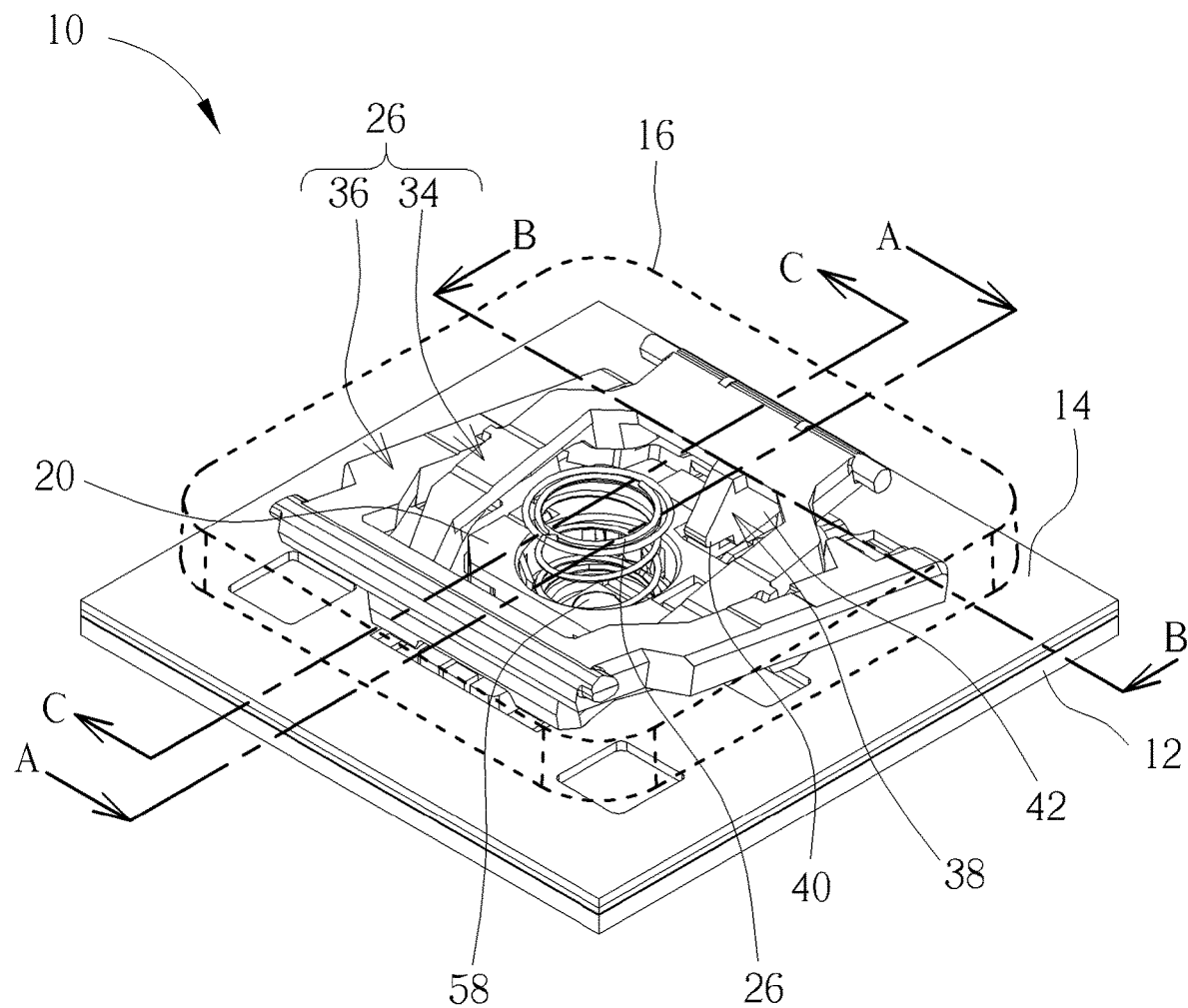
FIG. 1 is a diagram of a keyswitch according to an embodiment of the present invention.
Figure 2:
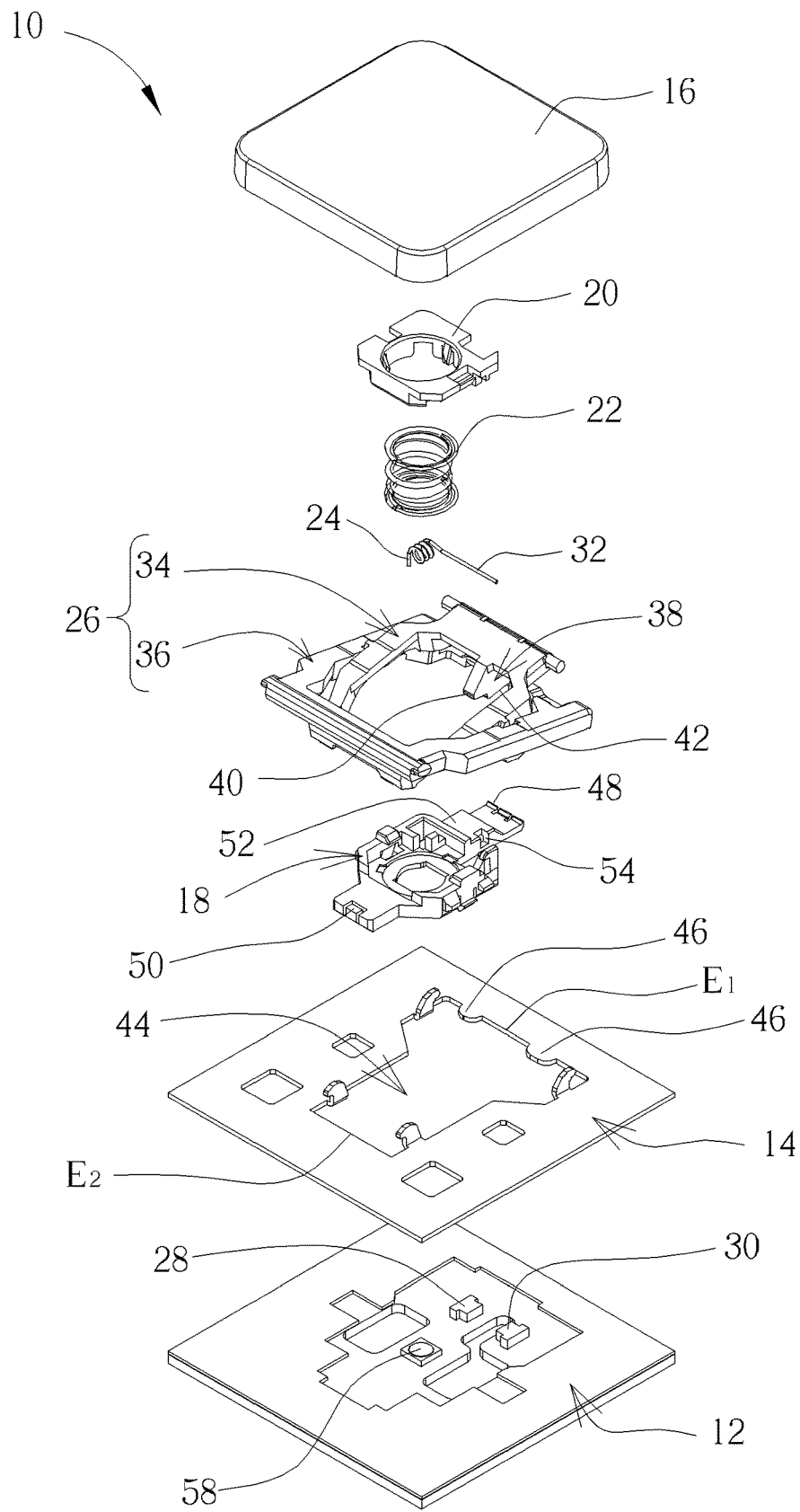
FIG. 2 is an exploded diagram of the keyswitch in FIG. 1.

Please refer to FIG. 1 and FIG. 2. FIG. 1 is a diagram of a keyswitch 10 according to an embodiment of the present invention. FIG. 2 is an exploded diagram of the keyswitch 10 in FIG. 1. For clearly showing the internal structural design of the keyswitch 10, the cap 16 is briefly depicted by dotted lines in FIG. 1. As show in FIG. 1 and FIG. 2, the keyswitch 10 includes a circuit board 12, a bottom board 14, a cap 16, a base 18, a cover 20, a first elastic member 22 (preferably a spring, but not limited thereto), a second elastic member 24 (preferably a torsional spring, but not limited thereto), a support device 26, a light receiver 28, and a light emitter 30. The circuit board 12 abuts against the bottom board 14. The cap 16 is located above the bottom board 14. The base 18 is disposed on the circuit board 12, and the cover 20 is disposed on the base 18. The first elastic member 22 is disposed through the base 18 and the cover 20 for driving the cap 16 away from the base 18 to generate the automatic returning effect. The second elastic member 24 is fixed to the base 18 and has a flexible rod 32. The support device 26 is disposed between the bottom board 14 and the cap 16 and includes a first support member 34 and a second support member 36. The first support member 34 and the second support member 36 are movably connected to the cap 16 and the bottom board 14 and pivotably intersect with each other to make the cap 16 movable relative to the bottom board 14. The first support member 34 has a sheet structure 38. The sheet structure 38 has a protruding rib 40 and a shielding board 42 extending toward the circuit board 12.

Figure 3:
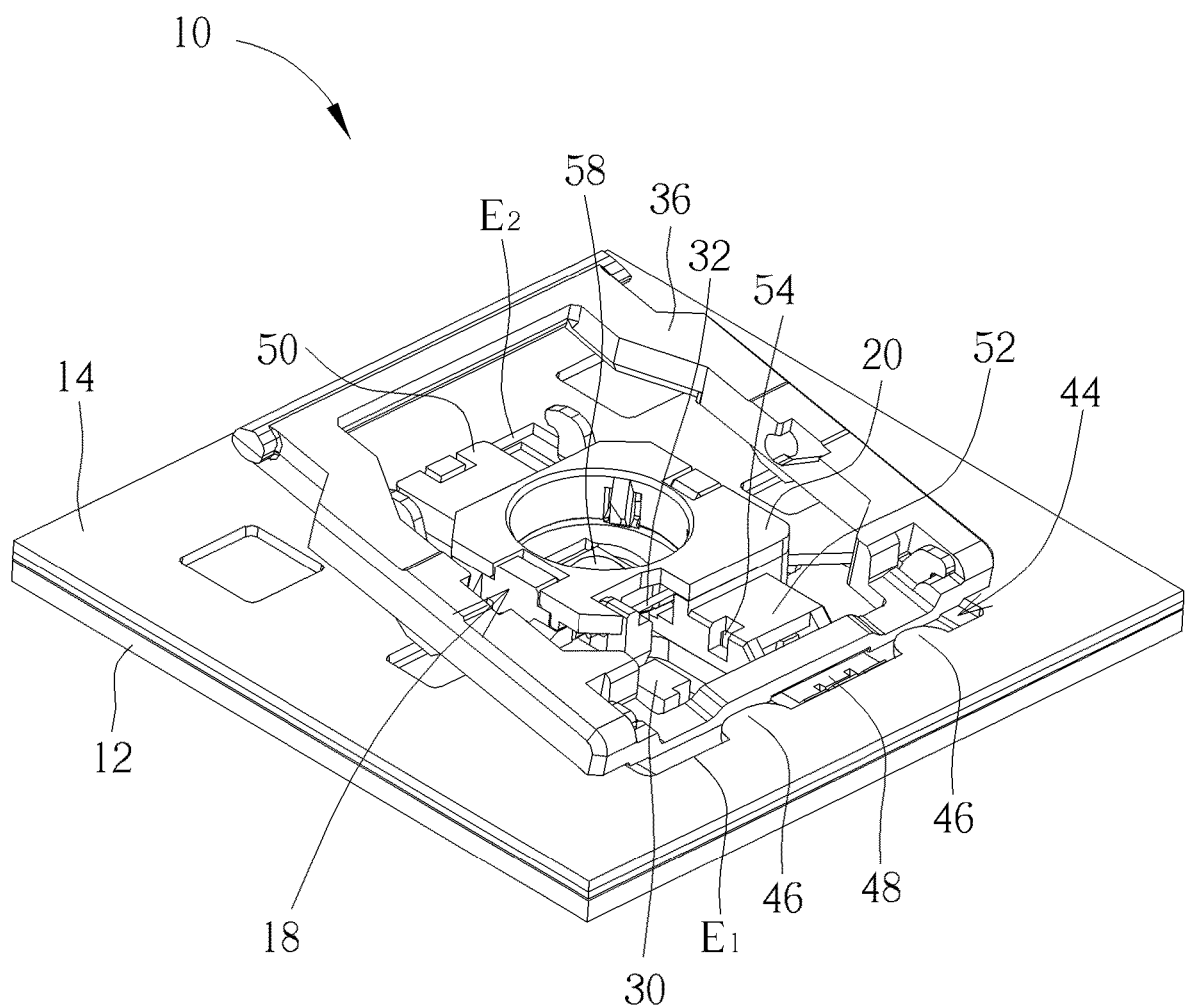
FIG. 3 is a diagram of the keyswitch in FIG. 1 omitting a cap, a first elastic member and a first support member.

Please refer to FIG. 1, FIG. 2, and FIG. 3. FIG. 3 is a diagram of the keyswitch 10 in FIG. 1 omitting the cap 16, the first elastic member 22 and the first support member 34. As shown in FIG. 1, FIG. 2, and FIG. 3, the bottom board 14 has a hollow region 44 corresponding to the support device 26. The first support member 34 is slidably connected to the cap 16 and is pivoted to the bottom board 14, and the second support member 36 is slidably connected to the bottom board 14 and is pivoted to the cap 16. Accordingly, when the cap 16 is pressed, with rotation of the first support member 34 and the second support member 36, an end of the second support member 36 connected to the bottom board 14 partially enters the hollow region 44, so as to reduce the overall height of the keyswitch 10 and partially contain the first support member 34 for allowing that the first support member 34 can be thickened appropriately to increase the structural strength of the support device 26. To be more specific, at least one limiting block 46 (two shown in FIG. 3, but not limited thereto) extends inwardly and horizontally from a first internal edge $E_1$ of the hollow region 44 corresponding to the end of the second support member 36 connected to the bottom board 14. As such, when the cap 16 is pressed and the end of the second support member 36 connected to the bottom board 14 partially enters the hollow region 44, the limiting block 46 can block the second support member 36 to prevent the second support member 36 from sliding laterally relative to the bottom board 14 during rotation of the first support member 34 and the second support member 36, so as to improve the pressing steadiness of the cap 16. Furthermore, as shown in FIG. 3, in this embodiment, a first abutting board 48 extends horizontally from the base 18 toward the first internal edge $E_1$ of the hollow region 44, and a second abutting board 50 extends horizontally from the base 18 toward a second internal edge $E_2$ of the hollow region 44 corresponding to an end of the first support member 34 pivoted to the bottom board 14. Accordingly, the first abutting board 48 and the second abutting board 50 can abut against the first internal edge $E_1$ and the second internal edge $E_2$ respectively to fix the base 18 in the hollow region 44 steadily.

Figure 4:
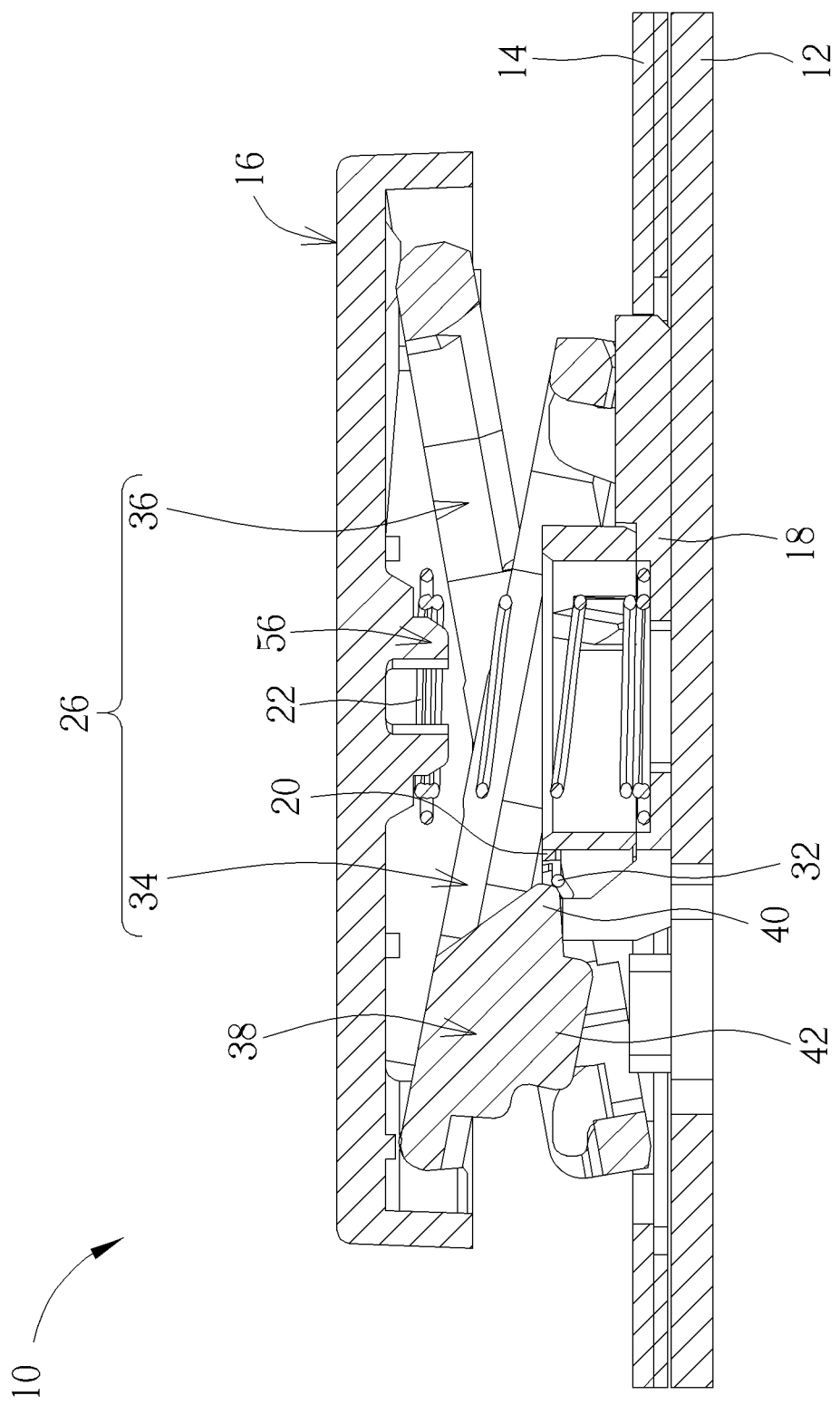
FIG. 4 is a cross-sectional diagram of the keyswitch in FIG. 1 along a cross-sectional line A-A when a protruding rib presses a flexible rod to deform with downward rotation of the first support member.
Figure 5:
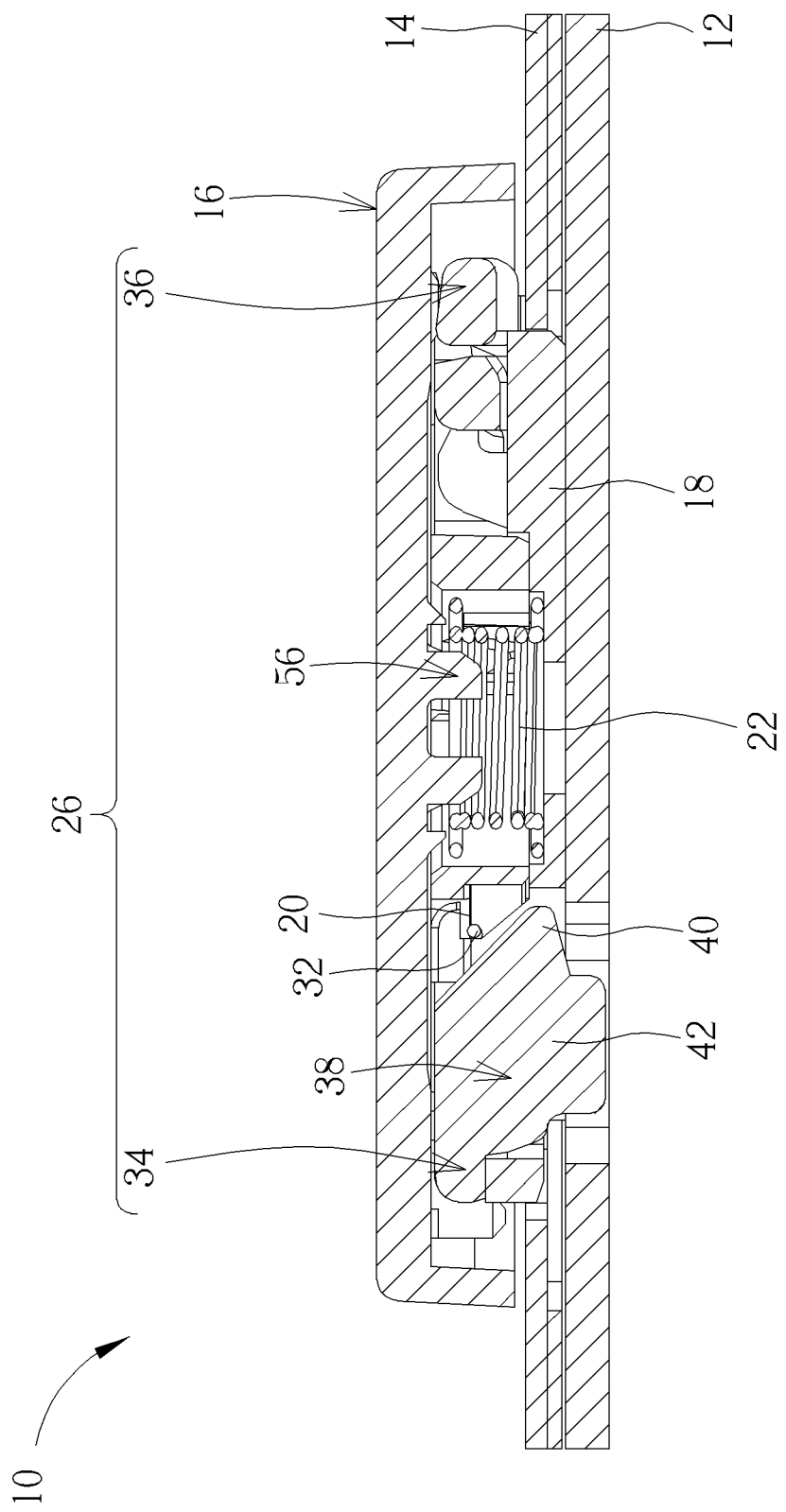
FIG. 5 is a cross-sectional diagram of the flexible rod in FIG. 4 crossing the protruding rib to be released.

Via the aforesaid design, the keyswitch 10 can provide a clicky tactile feedback with a click sound when the user presses the cap 16. To be more specific, please refer to FIG. 4 and FIG. 5. FIG. 4 is a cross-sectional diagram of the keyswitch 10 in FIG. 1 along a cross-sectional line A-A when the protruding rib 40 presses the flexible rod 32 to deform with downward rotation of the first support member 34. FIG. 5 is a cross-sectional diagram of the flexible rod 32 in FIG. 4 crossing the protruding rib 40 to be released. When the cap 16 is pressed by an external force to move downward, the first support member 34 and the second support member 36 rotate with downward movement of the cap 16. During the aforesaid process, the flexible rod 32 deforms downward with the protruding rib 40 (as shown in FIG. 4) when the first support member 34 rotates downward to make the protruding rib 40 press the flexible rod 32 and deformation of the flexible rod 32 caused by pressing of the protruding rib 40 is not enough to make the flexible rod 32 cross the protruding rib 40. Subsequently, when an upward recovering force generated by deformation of the flexible rod 32 increases to make the flexible rod 32 cross the protruding rib 40, the deformed flexible rod 32 is no longer pressed by the protruding rib 40. At this time, the flexible rod 32 is released to move upward to a position as shown in FIG. 5 and then collides with the cover 20 for making a click sound. In such a manner, the keyswitch 10 can provide a clicky tactile feedback when the protruding rib 40 presses the flexible rod 32 to deform and then the flexible rod 32 is released, and the keyswitch 10 can further provide a tactile feedback with a click sound when the flexible rod 32 collides with the cover 20.

Figure 6:
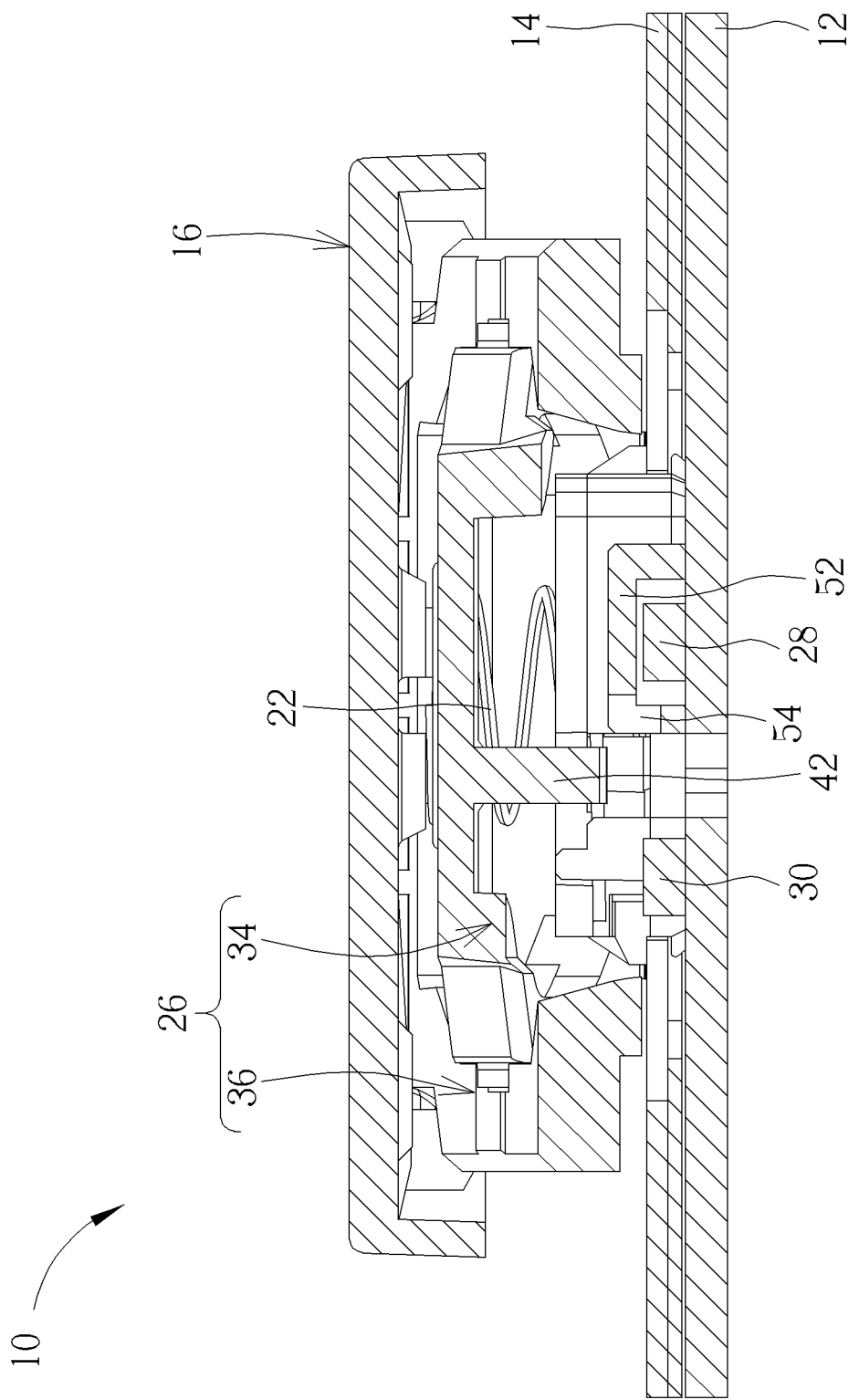
FIG. 6 is a cross-sectional diagram of the keyswitch in FIG. 1 along a cross-sectional line B-B.
Figure 7:
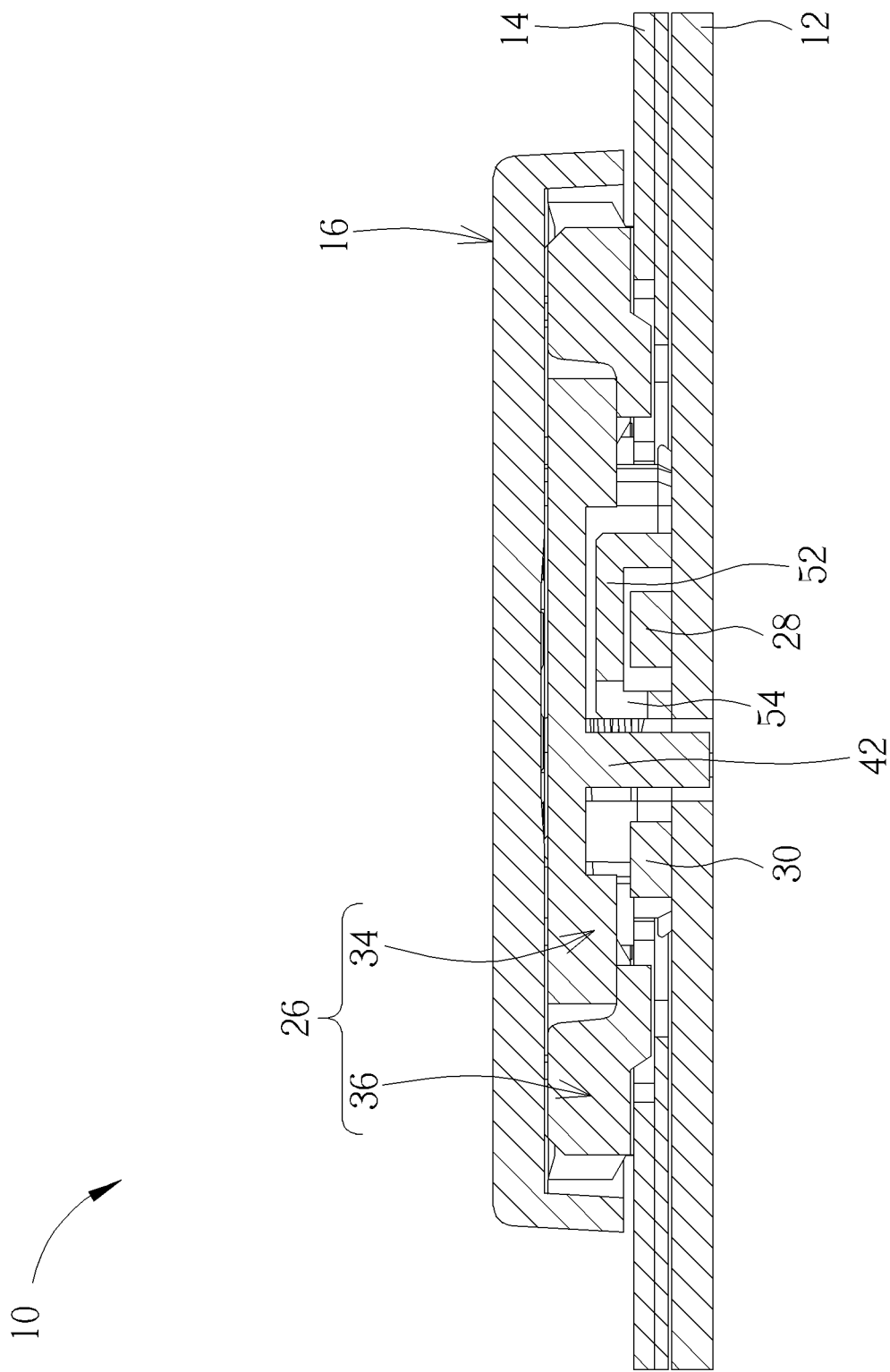
FIG. 7 is a cross-sectional diagram of the keyswitch in FIG. 6 when the cap is pressed.

Please refer to FIG. 2, FIG. 3, FIG. 6, and FIG. 7. FIG. 6 is a cross-sectional diagram of the keyswitch 10 in FIG. 1 along a cross-sectional line B-B. FIG. 7 is a cross-sectional diagram of the keyswitch 10 in FIG. 6 when the cap 16 is pressed. As shown in FIG. 2, FIG. 3, FIG. 6, and FIG. 7, the light receiver 28 is disposed on the circuit board 12, and the light emitter 30 is disposed on the circuit board 12 and is opposite to the light receiver 28. In this embodiment, the light receiver 28 could be preferably an infrared light receiving device and the light emitter 30 could be preferably an infrared light emitting device, but not limited thereto. Via the aforesaid design, when the cap 16 is not pressed, light emitted by the light emitter 30 can be incident to the light receiver 28 to establish light transmission between the light emitter 30 and the light receiver 28. Subsequently, during the process of the cap 16 being pressed by an external force from a non-pressed position as shown in FIG. 6 to a pressed position as shown in FIG. 7, the first support member 34 and the second support member 36 rotate with downward movement of the cap 16, so as to move the shielding board 42 to block the light transmission between the light emitter 30 and the light receiver 28. As such, a triggering signal is generated and then transmitted to the circuit board 12 for performing a corresponding input function.

On the other hand, when the external force is released, the first elastic member 22 can drive the cap 16 from the presses position as shown in FIG. 7 upward to the non-pressed position as shown in FIG. 6, so as to generate the effect that the cap 16 can return to its original position automatically. During the aforesaid process, the shielding board 42 can return to a position above the light emitter 30 with upward movement of the first support member 34 (as shown in FIG. 6). In such a manner, since the light transmission between the light emitter 30 and the light receiver 28 is no longer blocked, the keyswitch 10 does not generate a triggering signal. As for the related description for the aforesaid optical triggering design, it is commonly seen in the prior art and omitted herein. To be noted, in this embodiment, as shown in FIG. 2, FIG. 3 and FIG. 6, a cover structure 52 is formed on the base 18 corresponding to the light receiver 28. The cover structure 52 covers the light receiver 28 and has an opening 54 to ensure that light emitted by the light emitter 30 can only pass through the opening 54 to be incident to the light receiver 28. In such a manner, the present invention can solve the triggering failure problem caused by light emitted by the light emitter 30 being easily reflected to the light receiver 28 by the internal components (e.g. the cap 16 or the support device 26) of the keyswitch 10.

In summary, since the protruding rib of the flexible rod for pressing the elastic member and the shielding board for blocking the light transmission are both formed on the sheet structure of the first support structure, the present invention can efficiently solve the prior art problem that there exists an inconsistent time difference between keyswitch triggering and tactile feedback because the optical member and the protruding rib are disposed at the different positions. That is, via the design in which the tactile feedback effect and the light triggering effect can be generated by the sheet structure of the first support member, the keyswitch of the present invention can provide a consistent time difference between keyswitch triggering and tactile feedback when the user presses the cap.

Figure 8:
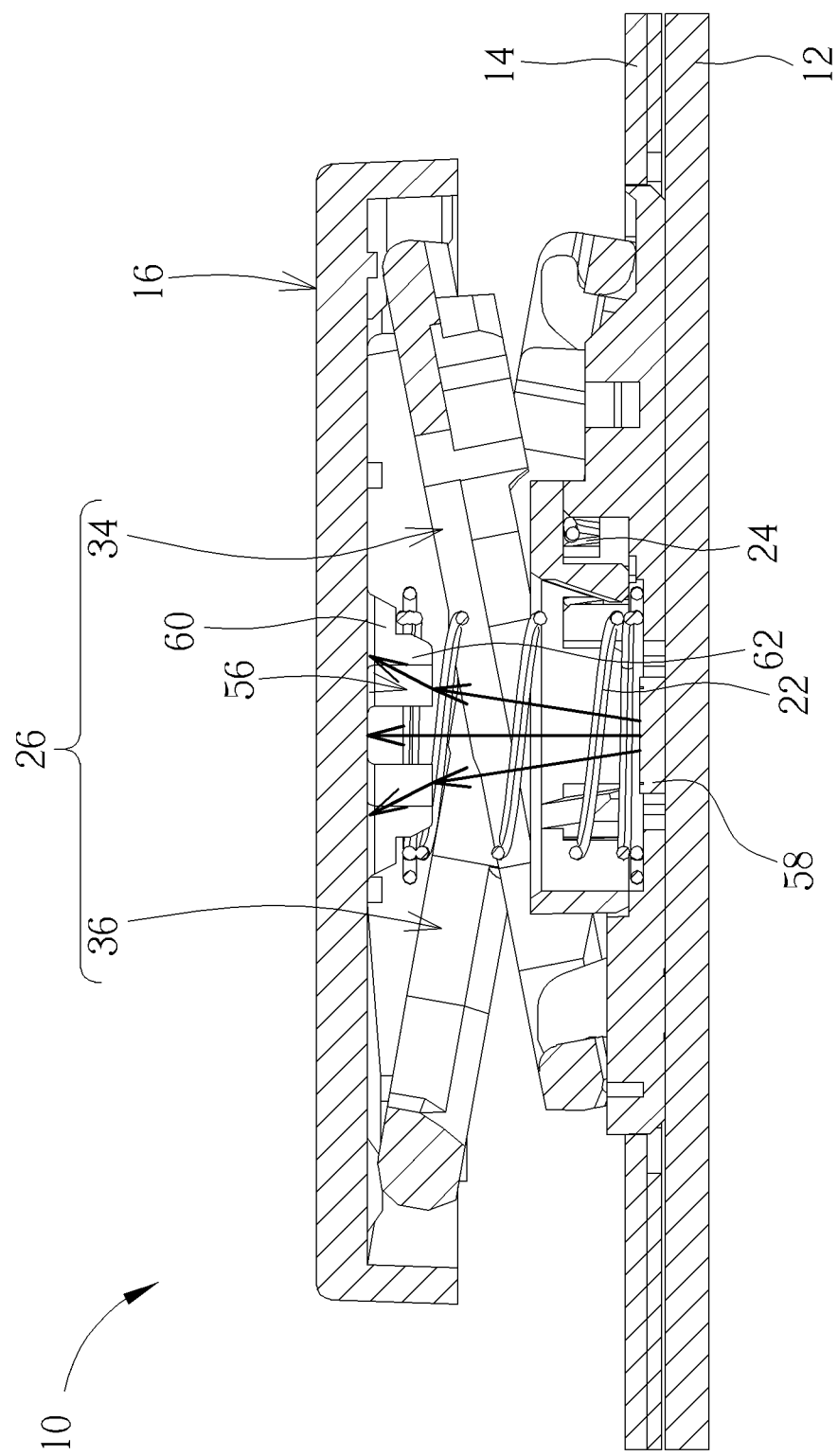
FIG. 8 is a cross-sectional diagram of the keyswitch in FIG. 1 along a cross-sectional line C-C.
Figure 9:
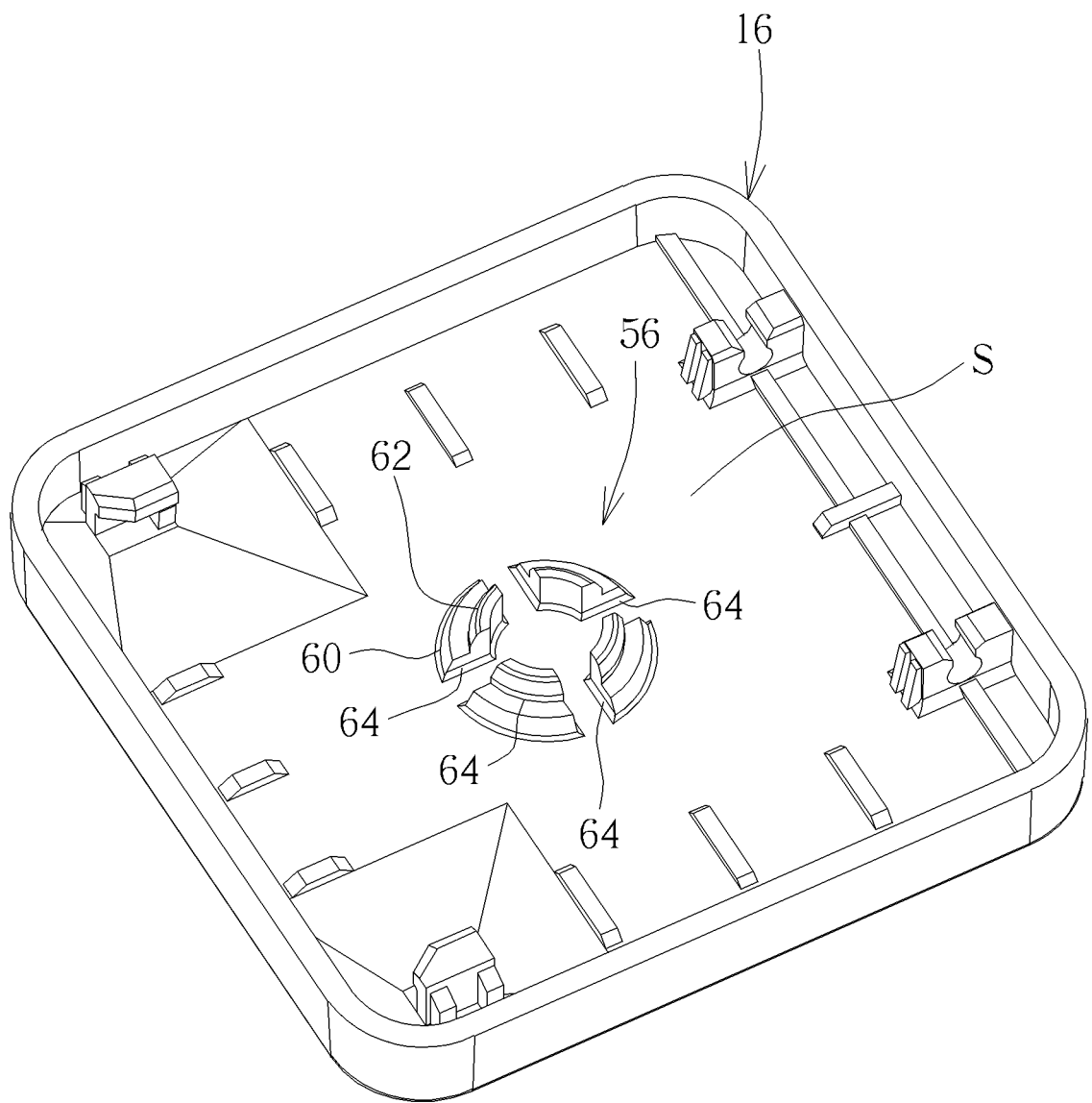
FIG. 9 is an enlarged diagram of the cap in FIG. 1 from another viewing angle.

In practical application, the present invention could further adopt the light emitting design. For example, please refer to FIG. 2, FIG. 8 and FIG. 9. FIG. 8 is a cross-sectional diagram of the keyswitch 10 in FIG. 1 along a cross-sectional line C-C. FIG. 9 is an enlarged diagram of the cap 16 in FIG. 1 from another viewing angle. As shown in FIG. 2, FIG. 8, and FIG. 9, a scattering block 56 protrudes from a bottom surface S of the cap 16 toward the first elastic member 22. The first elastic member 22 jackets the scattering block 56 to complete the assembly process of the cap 16 and the first elastic member 22. The keyswitch 10 further includes a light emitting unit 58. The light emitting unit 58 could be preferably a light emitting diode (but not limited thereto) and could be disposed on the circuit board 12 corresponding to the first elastic member 22. Accordingly, light emitted by the light emitting unit 58 can pass through the first elastic member 22, be incident into the scattering block 56, and then be emitted out of the cap 16 via scattering of the scattering block 56 (as shown in FIG. 8). As such, the present invention can solve the problem that light may be blocked by the first elastic member 22 to project shadow on the cap 16. To be more specific, as shown in FIG. 8 and FIG. 9, in this embodiment, the scattering block 56 could have an outer ring pad portion 60 and an inner ring connection portion 62. The first elastic member 22 jackets the inner ring connection portion 62 and abuts against the outer ring pad portion 60 to be separate from the bottom surface S. In such a manner, via the design that the first elastic member 22 is separate from the bottom surface S of the cap 16, the present invention can efficiently solve the aforesaid shadow problem. In addition, in this embodiment, the scattering block 56 could include a plurality of arc-shaped blocks 64 arranged alternately, so as to efficiently prevent the shrink marks formed on the cap 16 corresponding to the scattering block 56 (i.e. the position having an uneven thickness). Furthermore, the scattering block 56 could preferably be formed on a center position of the bottom surface S of the cap 16. To be noted, the present invention could adopt the design that the scattering block is formed on the bottom surface of the cap for scattering light emitted by the light emitting unit without the aforesaid keyswitch feedback and optical triggering designs.

It should be mentioned that the present invention could adopt the design that the keyswitch only provides a clicky tactile feedback. Please refer to FIG. 10 and FIG. 11. FIG.

Figure 10:
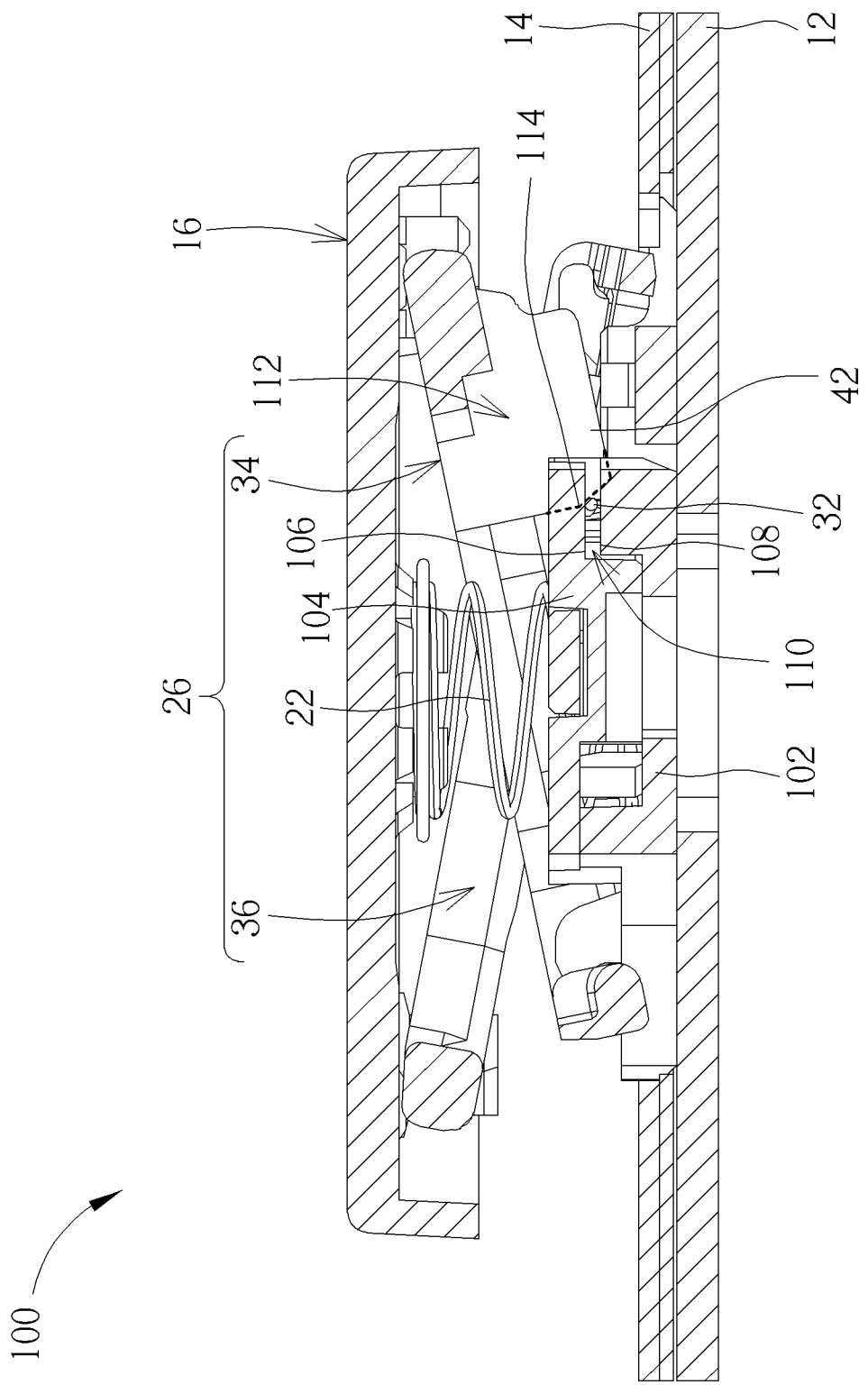
FIG. 10 is a cross-sectional diagram of a keyswitch when a protruding rib pressing the flexible rod to deform with downward rotation of the first support member according to another embodiment of the present invention.
Figure 11:
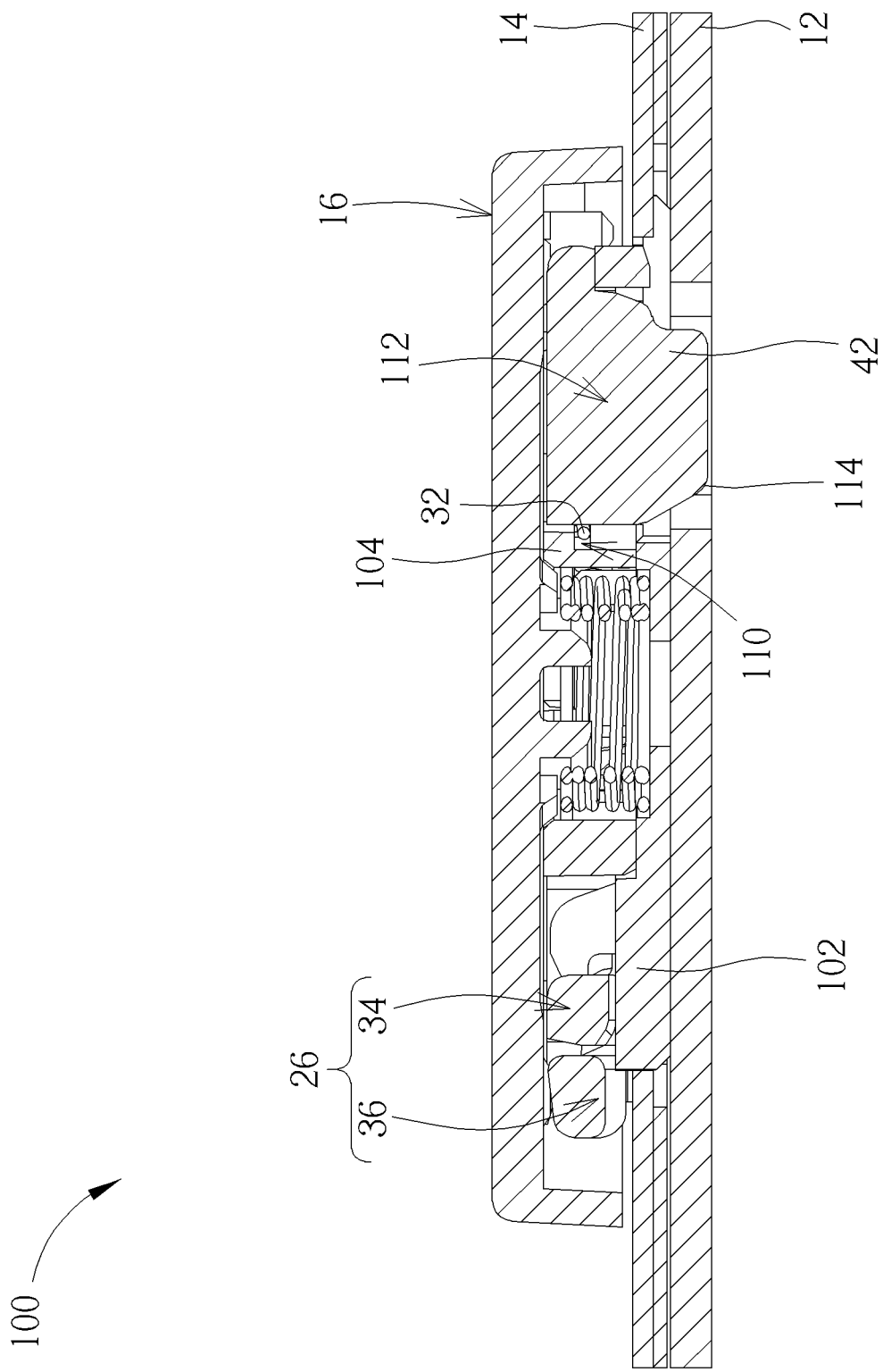
FIG. 11 is a cross-sectional diagram of the keyswitch in FIG. 10 when the flexible rod crosses the protruding rib to be released.

10 is a cross-sectional diagram of a keyswitch 100 when a protruding rib 114 pressing the flexible rod 32 to deform with downward rotation of the first support member 34 according to another embodiment of the present invention. FIG. 11 is a cross-sectional diagram of the keyswitch 100 in FIG. 10 when the flexible rod 32 crosses the protruding rib 114 to be released. Components both mentioned in this embodiment and the aforesaid embodiment represent components with similar structures or functions, and the related description is omitted herein. As shown in FIG. 10 and FIG. 11, the keyswitch 100 includes the circuit board 12, the bottom board 14, the cap 16, a base 102, a cover 104, the first elastic member 22, the second elastic member 24 (only a portion of the second elastic member 24 corresponding to the flexible rod 32 is shown in FIGS. 10 and 11), the support device 26, the light receiver 28 and the light emitter 30 (not shown in FIGS. 10 and 11). A first guiding surface structure 106 and a second guiding surface structure 108 are formed on the cover 104 and the base 102 respectively corresponding to the flexible rod 32. The first guiding surface structure 106 and the second guiding surface structure 108 are separate from each other to cooperatively form a limiting rail 110. The flexible rod 32 is movably inserted into the limiting rail 110. The first support member 34 has a sheet structure 112. The sheet structure 112 has the protruding rib 114 and the shielding board 42 extending toward the circuit board 12.

Via the aforesaid design, when the cap 16 is pressed by the external force and the first support member 34 rotates downward to make the protruding rod 114 press the flexible rod 32, the flexible rod 32 abuts against the protruding rod 114 and moves long the limiting rail 110 from a position as shown in FIG. 10 to a position as shown in FIG. 11. That is, the flexible rod 32 can cross the protruding rib 11 along the limiting rail 110 to provide a clicky tactile feedback when the user presses the cap 16. As for the related description for the other designs of the keyswitch 100 (e.g. the base structural design and the light emitting design), it could be reasoned by analogy according to the aforesaid embodiments and omitted herein.

Moreover, the present invention could adopt the design that the elastic member is omitted. In brief, in another embodiment that the elastic member is omitted, the keyswitch could include the circuit board, the bottom board, the cap, the base, the cover, the elastic member (preferably a spring, but not limited thereto), the support device, the light receiver, and the light emitter. The elastic member is disposed through the base and the cover. The elastic member drives the cap away from the cap to generate the automatic returning effect. The bottom board has a hollow region corresponding to the support device. The first support member and the second support member are movably connected to the cap and the bottom board and pivotably intersect with each other. At least one limiting block extends inwardly and horizontally from a first internal edge of the hollow region corresponding to an end of the second support member connected to the bottom board. As such, when the cap is pressed and the end of the second support member connected to the bottom board partially enters the hollow region, the limiting block can block the second support member to prevent the second support member from sliding laterally relative to the bottom board during rotation of the first support member and the second support member, so as to improve the pressing steadiness of the cap. Furthermore, since the flexible rod is omitted, the keyswitch can provide a non-clicky tactile feedback without a click sound when the user presses the cap. As for the related description for the other designs of the aforesaid keyswitch (e.g. the base structural design and the light emitting design), it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A keyswitch comprising:
a circuit board;
a bottom board abutting against the circuit board;
a cap located above the bottom board;
a light receiver disposed on the circuit board;
a light emitter disposed on the circuit board and opposite to the light receiver for emitting light to the light receiver;
a base disposed on the circuit board;
a cover disposed on the base;
a first elastic member disposed through the cover and the base to drive the cap away from the base;
a second elastic member fixed to the base, the second elastic member having a flexible rod; and
a support device disposed between the cap and bottom board, the support device comprising a first support member and a second support member, the first support member and the second support member being movably connected to the cap and the bottom board and pivotably intersecting with each other to make the cap movable relative to the bottom board, the first support member having a sheet structure, the sheet structure having a protruding rib and a shielding board extending toward the circuit board;
wherein when the cap is pressed, the shielding board moves downward with the first support member to block light transmission between the light emitter and the light receiver to generate a triggering signal;
when the cap is pressed and deformation of the flexible rod caused by pressing of the protruding rib is enough to make the flexible rod cross the protruding rib, the flexible rod is released and then moves upward to collide with the cover to make sound.

2. The keyswitch of claim 1, wherein the bottom board has a hollow region corresponding to the support device, the first support member is slidably connected to the cap and is pivoted to the bottom board, and the second support member is slidably connected to the bottom board and is pivoted to the cap;
when the cap is pressed, an end of the second support member connected to the bottom board partially enters the hollow region during rotation of the first support member and the second support member.

3. The keyswitch of claim 2, wherein at least one limiting block extends inwardly and horizontally from a first internal edge of the hollow region corresponding to the end of the second support member connected to the bottom board; when the cap is pressed and the end of the second support member partially enters the hollow region, the at least one limiting block blocks the end of the second support member connected to the bottom board.

4. The keyswitch of claim 3, wherein a first abutting board extends horizontally from the bottom board toward the first internal edge of the hollow region, a second abutting board extends horizontally from the bottom board toward a second internal edge of the hollow region corresponding to an end of the first support member pivoted to the bottom board, and the first abutting board and the second abutting board abut against the first internal edge and the second internal edge respectively to fix the bottom board in the hollow region.

5. The keyswitch of claim 1, wherein a scattering block protrudes from a bottom surface of the cap toward the first elastic member, the first elastic member jackets the scattering block, and the keyswitch comprises:
a light emitting unit disposed on the circuit board corresponding to the first elastic member, light emitted by the light emitting unit passing through the first elastic member, being incident into the scattering block, and then being emitted out of the cap via scattering of the scattering block.

6. The keyswitch of claim 5, wherein the scattering block comprises a plurality of arc-shaped blocks arranged alternately.

7. The keyswitch of claim 5, wherein the scattering block has an outer ring pad portion and an inner ring connection portion, and the first elastic member jackets the inner ring connection portion and abuts against the outer ring pad portion to be separate from the bottom surface.

8. The keyswitch of claim 1, wherein a cover structure is formed on the base corresponding to the light receiver, and the cover structure covers the light receiver and has an opening formed thereon to allow the light emitted by the light emitter to be incident to the light receiver through the opening.

9. A keyswitch comprising:
a circuit board;
a bottom board abutting against the circuit board;
a cap located above the bottom board;
a light receiver disposed on the circuit board;
a light emitter disposed on the circuit board and opposite to the light receiver for emitting light to the light receiver;
a base disposed on the circuit board;
a cover disposed on the base;
a first elastic member disposed through the cover and the base to drive the cap away from the base;
a second elastic member fixed to the base, the second elastic member having a flexible rod;
a first guiding surface structure and a second guiding surface structure being formed on the cover and the base respectively and being separate from each other to cooperatively form a limiting rail, the flexible rod being movably inserted into the limiting rail; and
a support device disposed between the cap and bottom board, the support device comprising a first support member and a second support member, the first support member and the second support member being movably connected to the cap and the bottom board and pivotably intersecting with each other to make the cap movable relative to the bottom board, the first support member having a sheet structure, the sheet structure having a protruding rib and a shielding board extending toward the circuit board;
wherein when the cap is pressed, the shielding board moves downward with the first support member to block light transmission between the light emitter and the light receiver to generate a triggering signal;
when the cap is pressed and the flexible rod is pressed by the protruding rib, the flexible rod crosses the protruding rib along the limiting rail.

10. The keyswitch of claim 9, wherein the bottom board has a hollow region corresponding to the support device, the first support member is slidably connected to the cap and is pivoted to the bottom board, and the second support member is slidably connected to the bottom board and is pivoted to the cap;
when the cap is pressed, an end of the second support member connected to the bottom board partially enters the hollow region during rotation of the first support member and the second support member.

11. The keyswitch of claim 10, wherein at least one limiting block extends inwardly and horizontally from a first internal edge of the hollow region corresponding to the end of the second support member connected to the bottom board; when the cap is pressed and the end of the second support member partially enters the hollow region, the at least one limiting block blocks the end of the second support member connected to the bottom board.

12. The keyswitch of claim 11, wherein a first abutting board extends horizontally from the bottom board toward the first internal edge of the hollow region, a second abutting board extends horizontally from the bottom board toward a second internal edge of the hollow region corresponding to an end of the first support member pivoted to the bottom board, and the first abutting board and the second abutting board abut against the first internal edge and the second internal edge respectively to fix the bottom board in the hollow region.

13. The keyswitch of claim 9, wherein a scattering block protrudes from a bottom surface of the cap toward the first elastic member, the first elastic member jackets the scattering block, and the keyswitch comprises:
a light emitting unit disposed on the circuit board corresponding to the first elastic member, light emitted by the light emitting unit passing through the first elastic member, being incident into the scattering block, and then being emitted out of the cap via scattering of the scattering block.

14. The keyswitch of claim 13, wherein the scattering block comprises a plurality of arc-shaped blocks arranged alternately.

15. The keyswitch of claim 13, wherein the scattering block has an outer ring pad portion and an inner ring connection portion, and the first elastic member jackets the inner ring connection portion and abuts against the outer ring pad portion to be separate from the bottom surface.

16. The keyswitch of claim 9, wherein a cover structure is formed on the base corresponding to the light receiver, and the cover structure covers the light receiver and has an opening formed thereon to allow the light emitted by the light emitter to be incident to the light receiver through the opening.

17. A keyswitch comprising:
a circuit board;
a bottom board abutting against the circuit board;
a cap located above the bottom board;
a light receiver disposed on the circuit board;
a light emitter disposed on the circuit board and opposite to the light receiver for emitting light to the light receiver;
a base disposed on the circuit board;
a cover disposed on the base;
an elastic member disposed through the base and the cover for driving the cap away from the base; and
a support device disposed between the cap and bottom board, the support device comprising a first support member and a second support member, the first support member and the second support member being movably connected to the cap and the bottom board and pivotably intersecting with each other to make the cap movable relative to the bottom board, the first support member having a sheet structure, the sheet structure having a shielding board extending toward the circuit board, the bottom board having a hollow region corresponding to the support device, at least one limiting block extending inwardly and horizontally from a first internal edge of the hollow region corresponding to an end of the second support member connected to the bottom board;

wherein when the cap is pressed, the shielding board moves downward with the first support member to block light transmission between the light emitter and the light receiver to generate a triggering signal;

when the cap is pressed and the end of the second support member partially enters the hollow region, the at least one limiting block blocks the end of the second support member connected to the bottom board.

18. The keyswitch of claim 17, wherein a first abutting board extends horizontally from the bottom board toward the first internal edge of the hollow region, a second abutting board extends horizontally from the bottom board toward a second internal edge of the hollow region corresponding to an end of the first support member pivoted to the bottom board, and the first abutting board and the second abutting board abut against the first internal edge and the second internal edge respectively to fix the bottom board in the hollow region.

19. The keyswitch of claim 17, wherein a scattering block protrudes from a bottom surface of the cap toward the first elastic member, the first elastic member jackets the scattering block, and the keyswitch comprises:

a light emitting unit disposed on the circuit board, light emitted by the light emitting unit passing through the first elastic member, being incident into the scattering block, and then being emitted out of the cap via scattering of the scattering block.

20. The keyswitch of claim 19, wherein the scattering block comprises a plurality of arc-shaped blocks arranged alternately.

21. The keyswitch of claim 19, wherein the scattering block has an outer ring pad portion and an inner ring connection portion, and the first elastic member jackets the inner ring connection portion and abuts against the outer ring pad portion to be separate from the bottom surface.

22. The keyswitch of claim 17, wherein a cover structure is formed on the base corresponding to the light receiver, and the cover structure covers the light receiver and has an opening formed thereon to allow the light emitted by the light emitter to be incident to the light receiver through the opening.

* * * * *